(12) United States Patent
Chuang et al.

(10) Patent No.: US 9,837,322 B2
(45) Date of Patent: Dec. 5, 2017

(54) SEMICONDUCTOR ARRANGEMENT AND METHOD OF FORMING

(71) Applicant: Taiwan Semiconductor Manufacturing Company Limited, Hsin-Chu (TW)

(72) Inventors: Harry-Hak-Lay Chuang, Crescent (SG); Wei Cheng Wu, Zhubei (TW); Chin-Yi Huang, Hsinchu (TW); Shih-Chang Liu, Alian Township (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 0 days.

(21) Appl. No.: 13/915,007

(22) Filed: Jun. 11, 2013

(65) Prior Publication Data

US 2014/0353794 A1 Dec. 4, 2014

Related U.S. Application Data

(60) Provisional application No. 61/827,988, filed on May 28, 2013.

(51) Int. Cl.
| | |
|---|---|
| *H01L 21/82* | (2006.01) |
| *H01L 21/02* | (2006.01) |
| *H01L 21/28* | (2006.01) |
| *H01L 29/06* | (2006.01) |
| *H01L 21/8238* | (2006.01) |

(52) U.S. Cl.
CPC .......................... *H01L 21/823878* (2013.01)

(58) Field of Classification Search
CPC ......... H01L 21/02365; H01L 21/28008; H01L 29/0611; H01L 29/06; H01L 21/02; H01L 21/28; H01L 21/82; H01L 21/823878
See application file for complete search history.

(56) References Cited

U.S. PATENT DOCUMENTS

| | | | | |
|---|---|---|---|---|
| 8,404,544 | B1 * | 3/2013 | Yin et al. | 438/275 |
| 8,871,598 | B1 * | 10/2014 | Perera | 438/299 |
| 2001/0044184 | A1 * | 11/2001 | Tanaka | H01L 27/105 438/258 |
| 2002/0011624 | A1 * | 1/2002 | Ishige | H01L 27/105 257/316 |
| 2004/0198009 | A1 * | 10/2004 | Chen et al. | 438/303 |
| 2007/0228444 | A1 * | 10/2007 | Nakata et al. | 257/314 |

(Continued)

FOREIGN PATENT DOCUMENTS

| | | |
|---|---|---|
| CN | 101714554 | 5/2010 |
| KR | 20000043821 A | 7/2000 |
| KR | 10-2000-0053598 | 8/2000 |

OTHER PUBLICATIONS

Corresponding Korean Office Action dated Jul. 3, 2015, 13 pages.

(Continued)

*Primary Examiner* — Fazli Erdem
(74) *Attorney, Agent, or Firm* — Cooper Legal Group, LLC

(57) ABSTRACT

A semiconductor arrangement is provided comprising a guard region. The semiconductor arrangement comprises an active region disposed on a first side of the guard region. The active region comprises an active device. The guard region of the semiconductor arrangement comprises residue from the active region. A method of forming a semiconductor arrangement is also provided.

20 Claims, 9 Drawing Sheets

(56) References Cited

U.S. PATENT DOCUMENTS

| | | | | |
|---|---|---|---|---|
| 2008/0093655 | A1* | 4/2008 | Lee | H01L 21/76229 257/316 |
| 2009/0256211 | A1* | 10/2009 | Booth, Jr. | H01L 21/823842 257/407 |
| 2010/0001369 | A1* | 1/2010 | Chuang et al. | 257/526 |
| 2010/0038692 | A1* | 2/2010 | Chuang | H01L 27/0629 257/298 |
| 2010/0052060 | A1* | 3/2010 | Lai et al. | 257/368 |
| 2010/0065898 | A1* | 3/2010 | Choi | H01L 29/78 257/296 |
| 2010/0084715 | A1* | 4/2010 | Shen et al. | 257/390 |
| 2010/0112728 | A1* | 5/2010 | Korzenski et al. | 438/3 |
| 2012/0025315 | A1 | 2/2012 | Kronholz et al. | |
| 2013/0034946 | A1* | 2/2013 | Chuang et al. | 438/382 |
| 2013/0217197 | A1* | 8/2013 | Hall et al. | 438/287 |
| 2013/0234252 | A1* | 9/2013 | Lee et al. | 257/368 |
| 2013/0264633 | A1* | 10/2013 | Hall et al. | 257/326 |
| 2013/0267072 | A1* | 10/2013 | Hall et al. | 438/258 |
| 2013/0285138 | A1* | 10/2013 | Vega et al. | 257/330 |
| 2014/0027859 | A1* | 1/2014 | Gerhardt et al. | 257/392 |
| 2014/0061813 | A1* | 3/2014 | Yu et al. | 257/369 |
| 2014/0120713 | A1* | 5/2014 | Shroff et al. | 438/593 |
| 2014/0225176 | A1* | 8/2014 | Cheek et al. | 257/314 |
| 2015/0041875 | A1* | 2/2015 | Perera | 257/314 |
| 2015/0129969 | A1* | 5/2015 | Chuang et al. | 257/368 |
| 2015/0137206 | A1* | 5/2015 | Liu et al. | 257/316 |
| 2015/0187783 | A1* | 7/2015 | Chuang et al. | 257/368 |

OTHER PUBLICATIONS

Corresponding Korean Application, Korean Office Action dated Mar. 7, 2016, 13 pages.
Corresponding Chinese Application 201310456166.3, Chinese Office Action dated Jul. 6, 8 pages.
Corresponding Korean Application 10-2014-0059888, Korean Office Action dated Sep. 29, 2016, 11 pages.
Corresponding Chinese Application 201310456169.3, Chinese Office Action dated Jan. 19, 2017, 7 pages.
Corresponding Korean Application Office Action dated Sep. 5, 2017 (5 pgs).

* cited by examiner

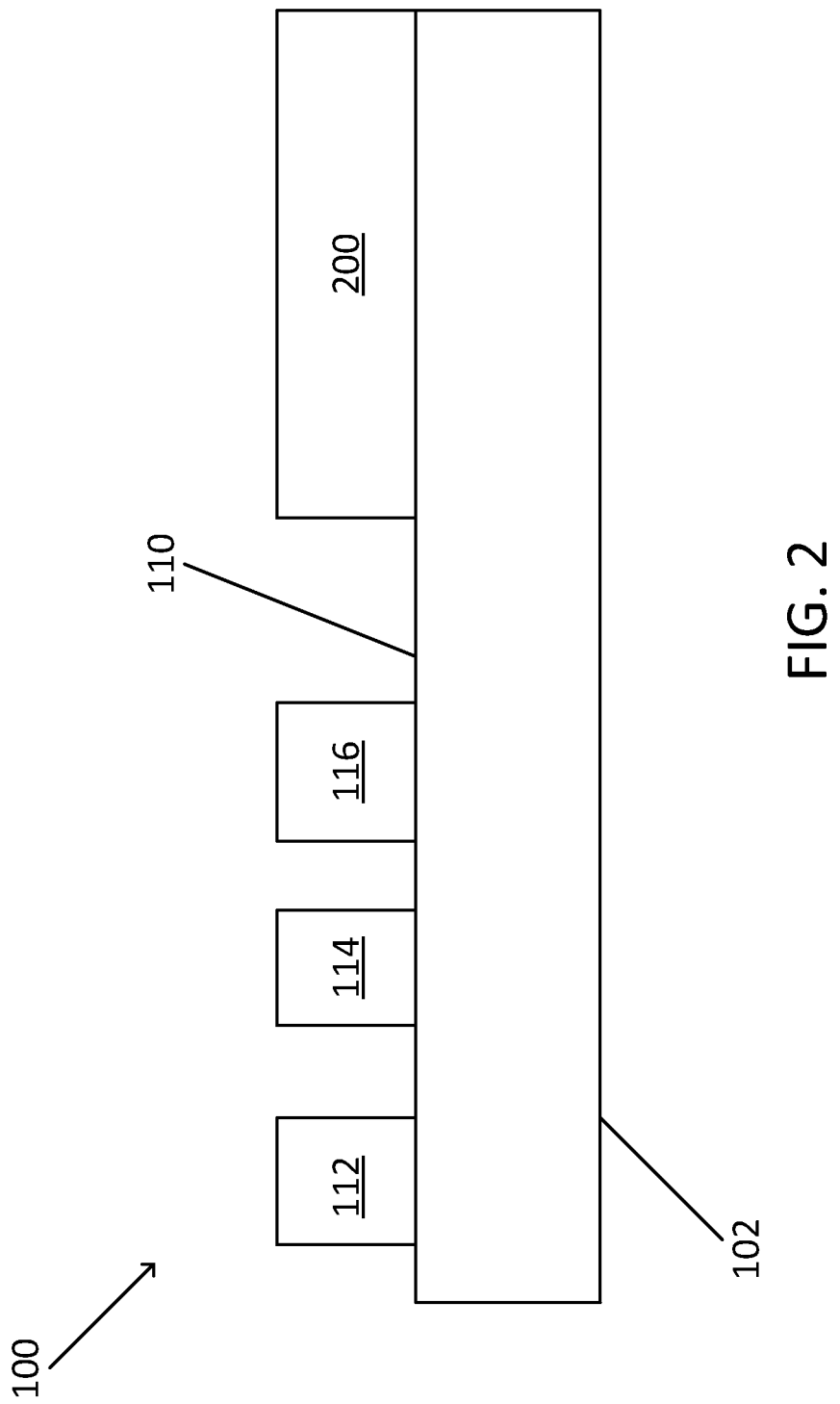

SEMICONDUCTOR ARRANGEMENT AND METHOD OF FORMING

BACKGROUND

Various materials have been used for forming complementary metal-oxide-semiconductor (CMOS) devices and non-volatile memory devices. A high-k dielectric has been used in fabricating a gate dielectric.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor arrangement are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

FIG. 2 illustrates a portion of a semiconductor arrangement, according to an embodiment;

DETAILED DESCRIPTION

Figure 1A:
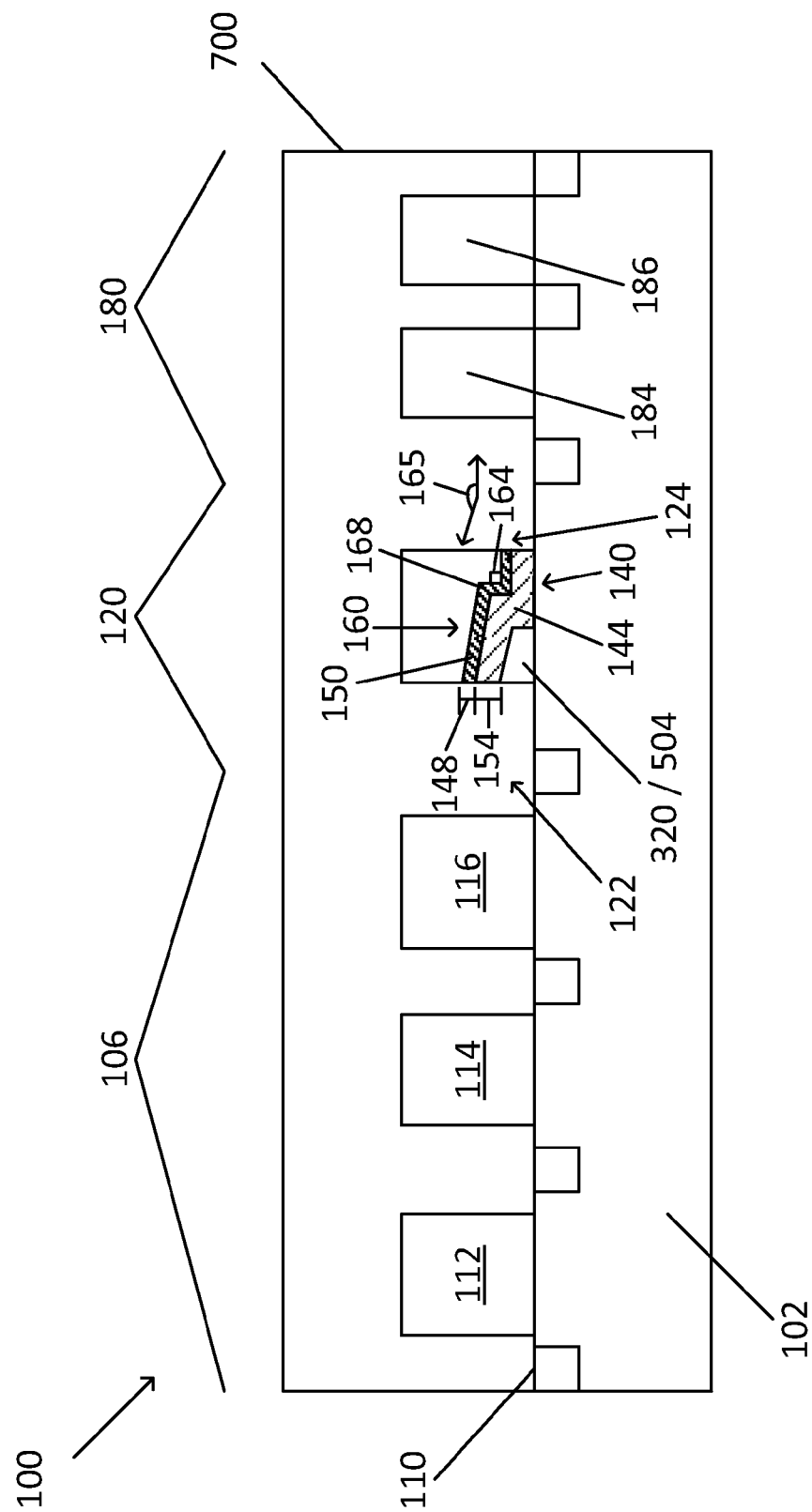
FIG. 1a illustrates an elevation view of a semiconductor arrangement, according to an embodiment.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

FIG. 1a is a plan view illustrating a semiconductor arrangement 100, according to some embodiments. In an embodiment, the semiconductor arrangement 100 is formed upon a substrate 102. The substrate 102 comprises any number of materials, such as, for example, silicon, germanium, etc., alone or in combination. In some embodiments, the substrate 102 comprises various doping configurations, such as an n-well doping or p-well doping. According to some embodiments, the substrate 102 comprises an epitaxial layer, a silicon-on-insulator (SOI) structure, etc. According to some embodiments, the substrate corresponds to a wafer or a die formed from a wafer.

The semiconductor arrangement 100 comprises an active region 106 disposed on a surface 110 of the substrate 102. In some embodiments, the active region 106 comprises one or more active devices. For example, in an embodiment, the active region 106 comprises a first active device 112, a second active device 114, and a third active device 116. The active devices 112, 114, 116 comprise any type of devices, such as, for example, memory, non-volatile memory, static random access memory (SRAM), P-channel field effect transistors (pFETs), N-channel field effect transistors (nFETs), metal-oxide semiconductor field effect transistors (MOSFETs), complementary metal-oxide semiconductor (CMOS) transistors, bipolar junction transistors (BJTs), high voltage transistors, memory cells, select gates, memory gates, etc., alone or in combination. In some embodiments, the active devices 112, 114, 116 comprise a poly-OX—SiN—OX—Si non-volatile memory. In some embodiments, the active devices 112, 114, 116 comprise a poly-SiON CMOS transistor. In some embodiments, at least one of the active devices 112, 114, 116 comprise a same active device. In some embodiments, at least some of the active devices do not comprise a same active device.

Figure 1B:
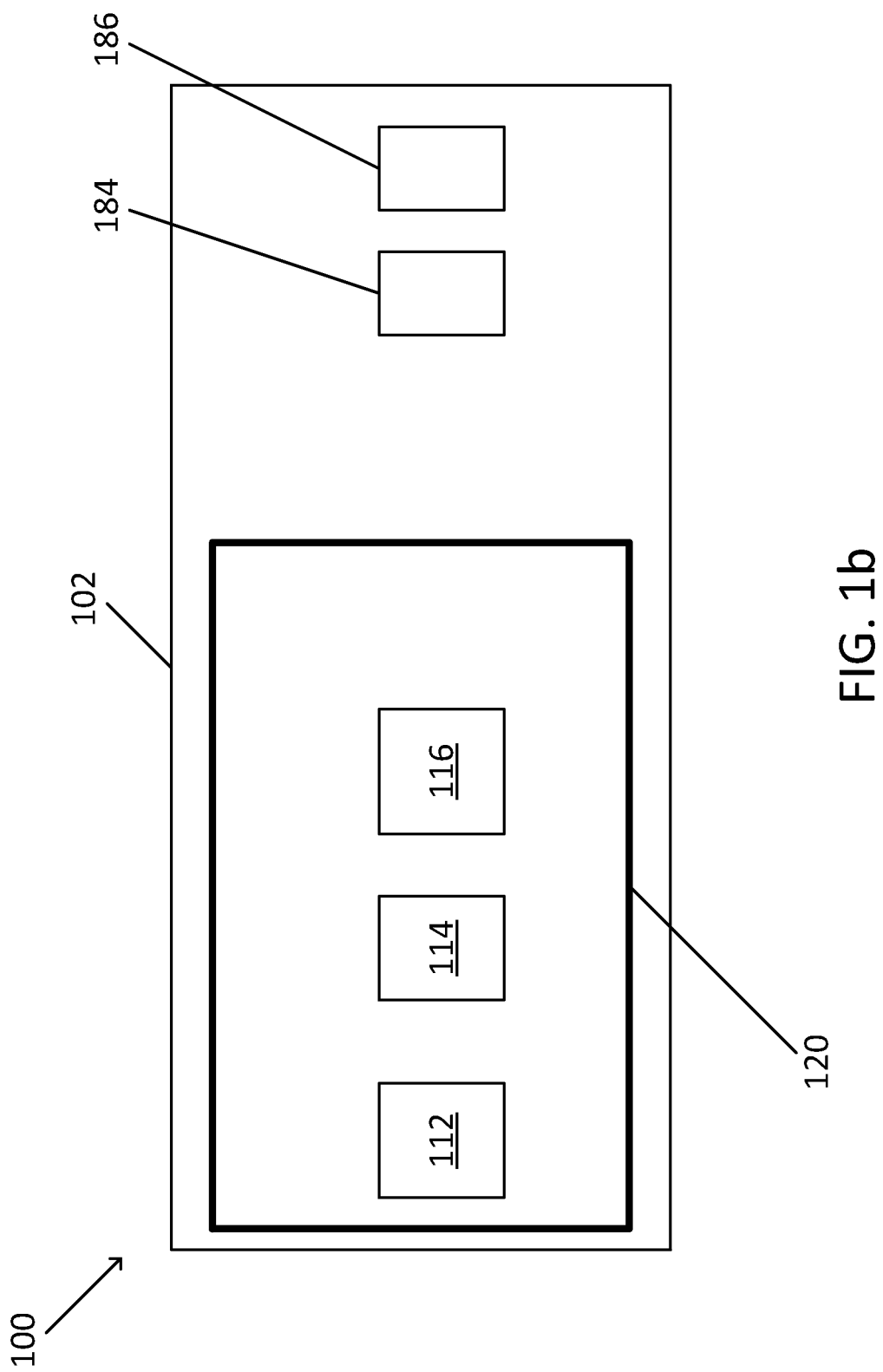
FIG. 1b illustrates a plan view of a semiconductor arrangement, according to an embodiment.

The semiconductor arrangement 100 comprises a guard region 120 disposed on the surface 110 of the substrate 102. In an embodiment, the guard region 120 is disposed on the surface 110 of a shallow trench isolation region in the substrate 102. In some embodiments, the shallow trench isolation region comprises an oxide, alone or in combination with other materials. In an embodiment, the guard region 120 comprises a first side 122 and a second side 124, with the active region 106 disposed on the first side 122 of the guard region 120. According to some embodiments, the guard region 120 surrounds the active region 106 and the active devices 112, 114, 116. As illustrated in FIG. 1b, in some embodiments, the guard region 120 comprises a quadrilateral shape such as a rectangle, square, etc. The guard region 120 is envisioned to comprise any number of shapes, however, including, for example, rounded shapes, such as circles and ovals, lines, polygons, broken shapes, etc., alone or in combination.

In some embodiments, the guard region 120 includes a residue 140 comprising one or more layers. According to some embodiments, the residue 140 comprises a dielectric layer 144. In an embodiment, the dielectric layer 144 is disposed towards a bottom of the guard region 120, such as at or near the surface 110 of the substrate 102. In an embodiment, the dielectric layer 144 comprises a dielectric material with a relatively high dielectric constant. In some embodiments, the dielectric layer 144 comprises HfSiO, HfSiON, HfTaO, HfTiO, HtZrO, AlO, ZrO, TiO, $Ta_2O_5$, $Y_2O_3$, $SrTiO_3$ (STO), $BaTiO_3$ (BTO), HaZrO, HfLaO, HfSiO, LaSiO, AlSiO, $(Ba, Sr)TiO_3$ (BST), $Al_2O_3$, $Si_3N_4$, oxynitrides, high-k dielectric materials, etc., alone or in combination. According to some embodiments, the dielectric layer 144 comprises a standard dielectriC material with a medium dielectric constant, such as $SiO_2$, for example. The dielectric layer 144 is formed in any number of ways, such as by atomic layer deposition (ALD), chemical vapor deposition (CVD), physical vapor deposition (PVD), etc. In an embodiment, the dielectric layer comprises a thickness 154 of about 1 nm to about 6 nm, for example.

In some embodiments, the residue 140 comprises a conductive layer 150. In some embodiments, the conductive layer comprises a metal gate, or rather a portion of a layer of metal used in forming metal gates. In an embodiment, the conductive layer 150 is disposed within the guard region 120 above the dielectric layer 144. According to some embodiments, the conductive layer 150 comprises aluminum, copper, tungsten, titanium, TiN, TaN, AlN, etc., alone or in combination. In an embodiment, the conductive layer 150 comprises a thickness 148 of about 1 nm to about 6 nm, for example. As discussed further below, according to some embodiments, the residue 140 comprises a second portion 504 of a first layer of semiconductor material 320.

In some embodiments, the residue 140 comprises a profile 160 within the guard region 120. In an embodiment, the profile 160 comprises an angle 164 of approximately 90 degrees relative to the surface 110 of the substrate 102 upon which the semiconductor arrangement 100 is formed. According to some embodiments, the profile 160 of the residue 140 comprises a corner 168. In some embodiments, the profile comprises a second angle 165 which is an obtuse angle (e.g., angle of about 90 degrees to about 180 degrees) relative to the surface 110 of the substrate 102 upon which the semiconductor arrangement 100 is formed. In an embodiment, the obtuse angle is at least about 145 degrees.

The semiconductor arrangement 100 comprises a non-active region 180 disposed on the surface 110 of the substrate 102. In some embodiments, the non-active region 180 comprises a high-k metal gate region. According to some embodiments, the non-active region 180 is disposed on the second side 124 of the guard region opposite the active region 106. In some embodiments, the non-active region 180 comprises one or more non-active devices, such as, for example, a first non-active device 184 and a second non-active device 186. The non-active devices 184, 186 include any type of devices, such as, for example, logic devices, static random access memory (SRAM), select gates, memory gates, complementary metal-oxide semiconductor (CMOS) transistors, etc., alone or in combination. In some embodiments, the non-active devices 184, 186 of the non-active region 180 comprise a poly-SiON device. In some embodiments, at least some of the non-active devices comprise high-k metal gate devices.

FIG. 2 is an elevation view of the semiconductor arrangement 100, such as at a particular stage of fabrication, according to some embodiments. In an embodiment, the semiconductor arrangement 100 includes a dummy structure 200 formed in the non-active region 180. In some embodiments, the dummy structure 200 is disposed on the surface 110 of the substrate 102 on the second side 124 of the guard region 120. The dummy structure 200 is formed in any number of ways, such as by CVD, for example.

Figure 3:
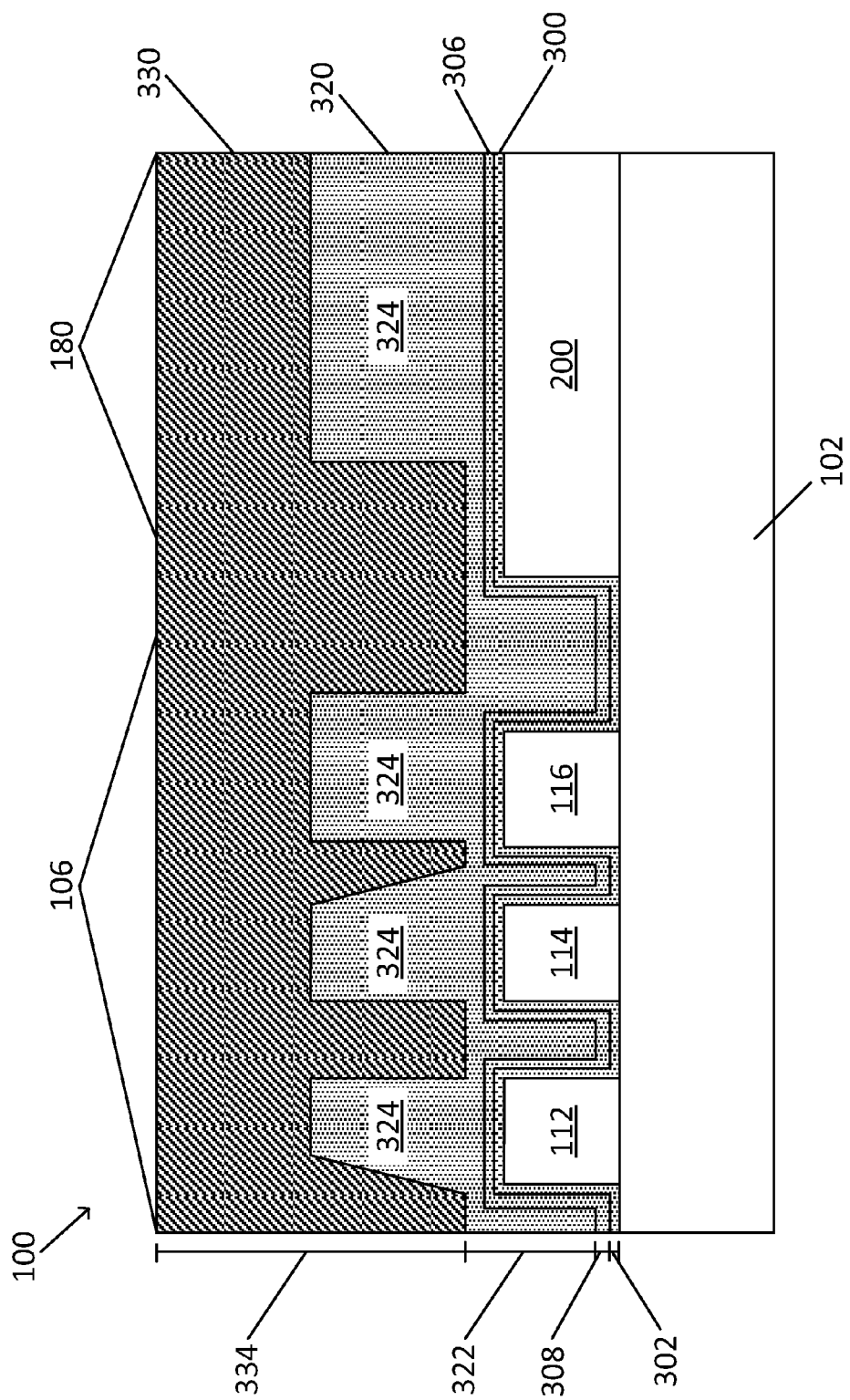
FIG. 3 illustrates forming a first layer of semiconductor material associated with forming a semiconductor arrangement, according to an embodiment.

FIG. 3 is an elevation view of the semiconductor arrangement 100, such as at a particular stage of fabrication, according to some embodiments. In an embodiment, a dielectric layer 300 is formed over the active region 106, active devices 112, 114, 116, non-active region 180, and dummy structure 200. The dielectric layer 300 is formed in any number of ways, such as by chemical vapor deposition (CVD), high density plasma CVD (HDP-CVD), or other suitable methods, for example. The dielectric layer 300 comprises any number of materials, including, for example, oxides, silicon dioxide, etc., alone or in combination. In some embodiments, the dielectric layer 300 comprises a thickness 302 of about 2 nm to about 8 nm, for example.

In an embodiment, a barrier layer 306 is formed over the dielectric layer 300. The barrier layer 306 comprises any number of materials, including nitride, silicon nitride, etc., alone or in combination. In an embodiment, the barrier layer 306 functions as a stopping layer or etch stop layer (ESL). According to some embodiments, the barrier layer 306 is formed over the active region 106 and the non-active region 180 such that the barrier layer 306 covers the active devices 112, 114, 116 and the dummy structure 200. In some embodiments, the barrier layer 306 comprises a thickness 308 of about 2 nm to about 8 nm, for example.

In an embodiment, a first layer of semiconductor material 320 is formed over the active region 106 and over the non-active region 180. In an embodiment, the first layer of semiconductor material 320 is formed over the barrier layer 306. The first layer of semiconductor material 320 is formed in any number of ways, such as by deposition, for example. According to some embodiments, the first layer of semiconductor material 320 comprises silicon, polysilicon, etc. alone or in combination. In an embodiment, the first layer of semiconductor material 320 comprises a thickness 322 of about 100 nm to about 200 nm, for example. In some embodiments, the first layer of semiconductor material 320 comprises a generally non-planar shape, such that the first layer of semiconductor material 320 includes features 324 that at least partially reflect a location and shape of a structure thereunder, such as active devices 112, 114, 116.

In an embodiment, a bottom anti-reflective coating (BARC) layer 330 is formed over the active region 106 and over the non-active region 180. In an embodiment, the BARC layer 330 is formed over the first layer of semiconductor material 320. The BARC layer 330 includes any number of materials, alone or in combination. In an embodiment, the BARC layer 330 comprises a thickness 334 of about 100 nm to about 200 nm, for example.

Figure 4:
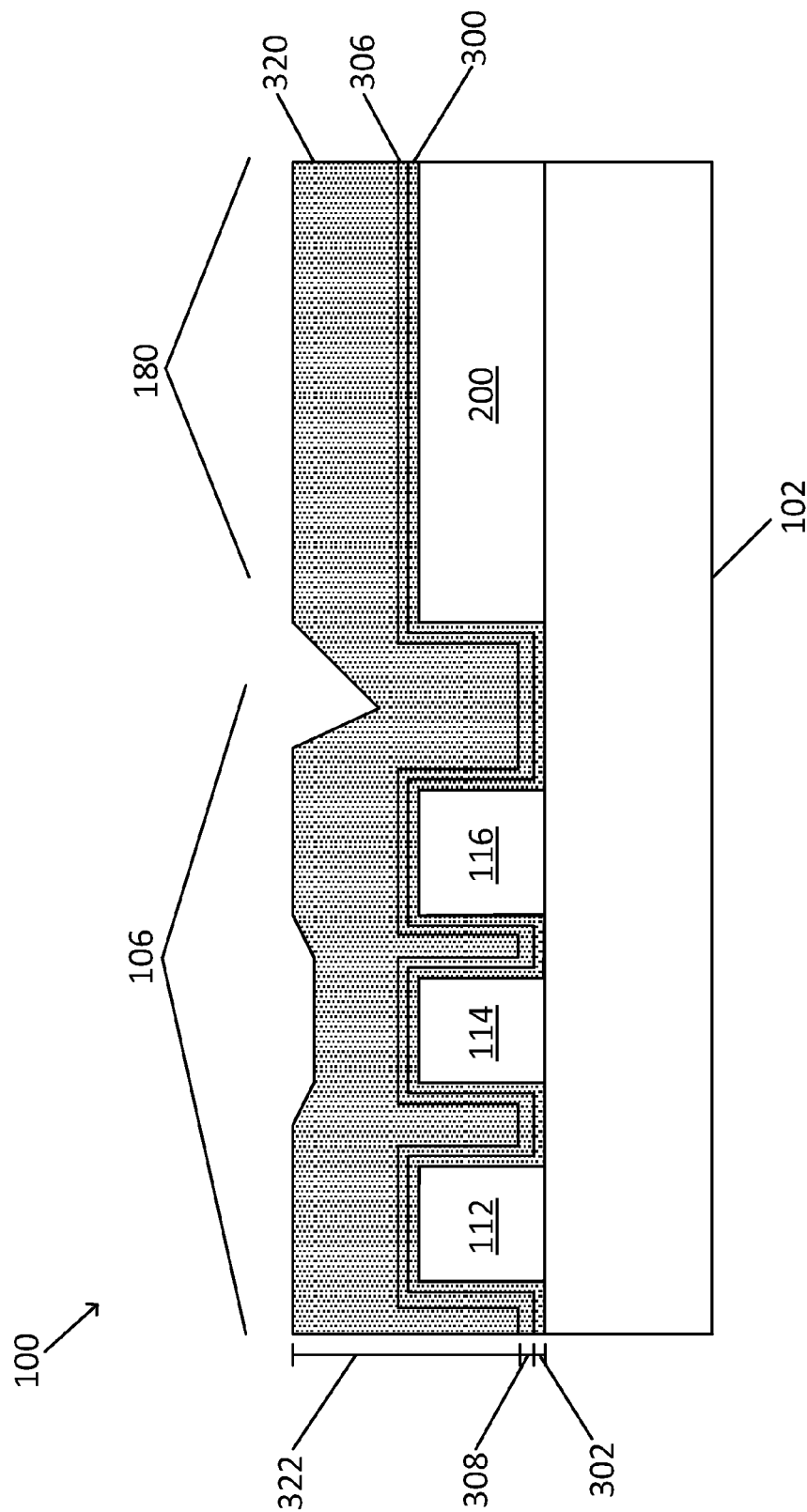
FIG. 4 illustrates patterning associated with forming a semiconductor arrangement, according to an embodiment.

Turning to FIG. 4, in an embodiment, the BARC layer 330 is removed, such as by etching, for example. According to some embodiments, an etch chemistry comprising $SF_6$, $CF_4$, $CL_2$, $O_2$ gas, etc., alone or in combination is used to etch the BARC layer 330 and at least some of the first layer of semiconductor material 320. According to some embodiments, the first layer of semiconductor material 320 is then planarized, such as by a chemical mechanical polishing (CMP) process, for example. In some embodiments, by being planarized, the first layer of semiconductor material 320 has a generally flat, planar shape.

Figure 5:
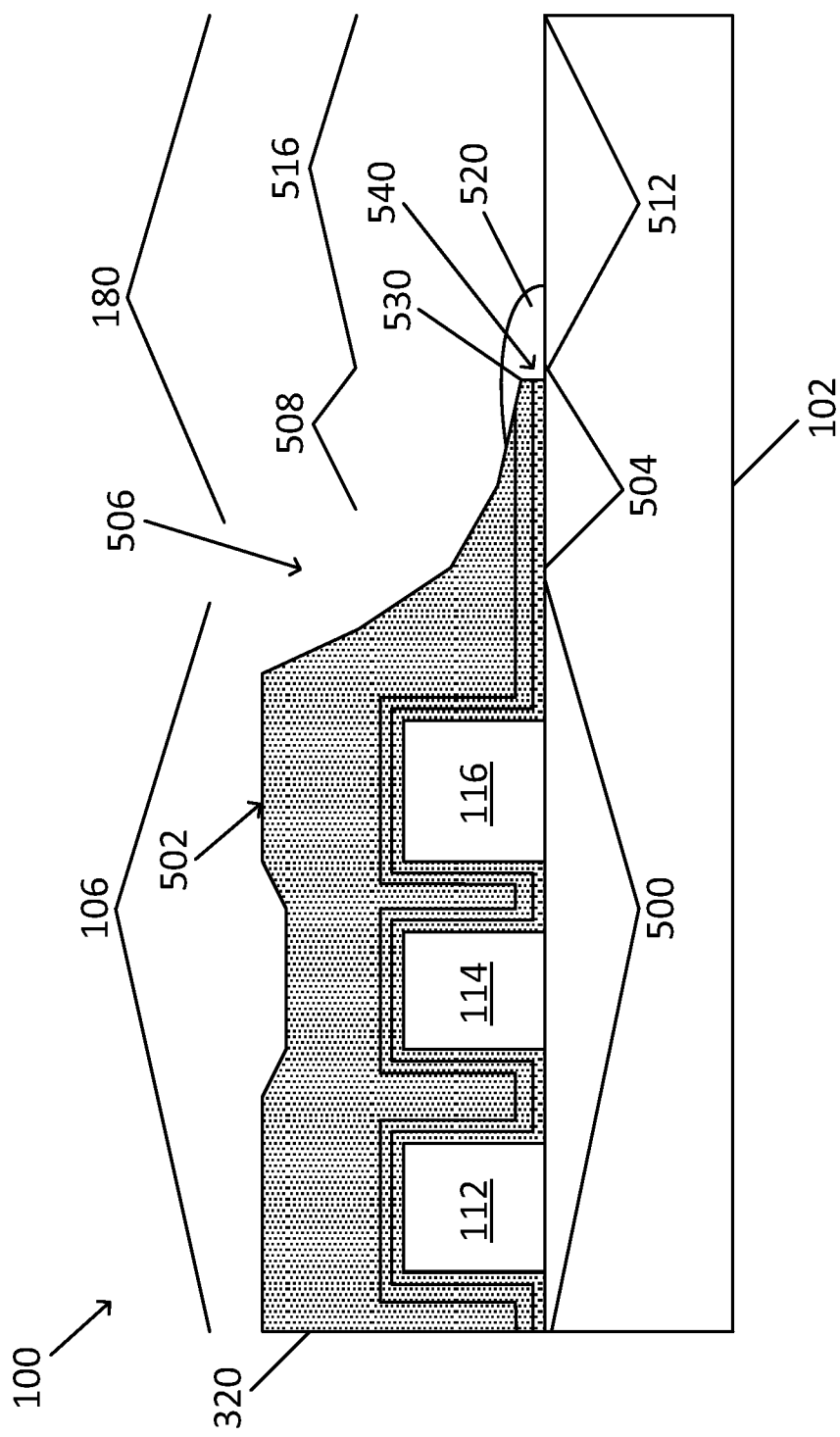
FIG. 5 illustrates patterning associated with forming a semiconductor arrangement, according to an embodiment.

Turning to FIG. 5, in an embodiment, the first layer of semiconductor material 320 is patterned such that a first portion 500 of the first layer 320 remains over the active region 106, a second portion 504 of the first layer 320 remains over a first area 508 of the non-active region 180. In some embodiments, the non-active region 180 comprises a high-k metal gate region. In an embodiment, a third portion 512 of the first layer 320 and the dummy structure 200 are removed from a second area 516 of the non-active region 180 thereby exposing the second area 516. The first layer 320 and dummy structure 200 are patterned and removed in any number of ways, such as in one or more operations. According to some embodiments, the first layer 320 is patterned and the dummy structure 200 is removed such as by wet etching or dry etching, for example. In some embodiments, a suitable etch chemistry includes $SF_6$, $CL_2$, $CF_4$, HBr, $O_2$ gas, $HeO_2$, etc., alone or in combination.

According to some embodiments, the first portion 500 of the first layer 320 remains over the active region 106 after the first layer 320 is patterned. In some embodiments, for example, the first portion 500 of the first layer 320 will cover the first active device 112, second active device 114, and third active device 116. In an embodiment, an upper surface 502 of the first portion 500 has a generally planar shape. In some embodiments, the second portion 504 of the first layer 320 remains over the first area 508 of the non-active region 180. In an embodiment, the second portion 504 includes a contoured shape 506. The contoured shape 506 comprises any number of sizes, shapes, angles, configurations, etc. In an embodiment, the contoured shape 506 forms an obtuse angle 520, for example, with respect to the surface 110 of the substrate 102. In an embodiment, the contoured shape comprises a corner 530. In some embodiments, the contoured shape 506 comprises an angle 540 of about 90 degrees relative to the surface 100 of the substrate 102. It will be appreciated that at least some of the contoured shape 506 corresponds to, comprises or defines the profile 160 of the residue 140 in the guard region 120, as illustrated in FIG. 1a, for example.

Figure 6:
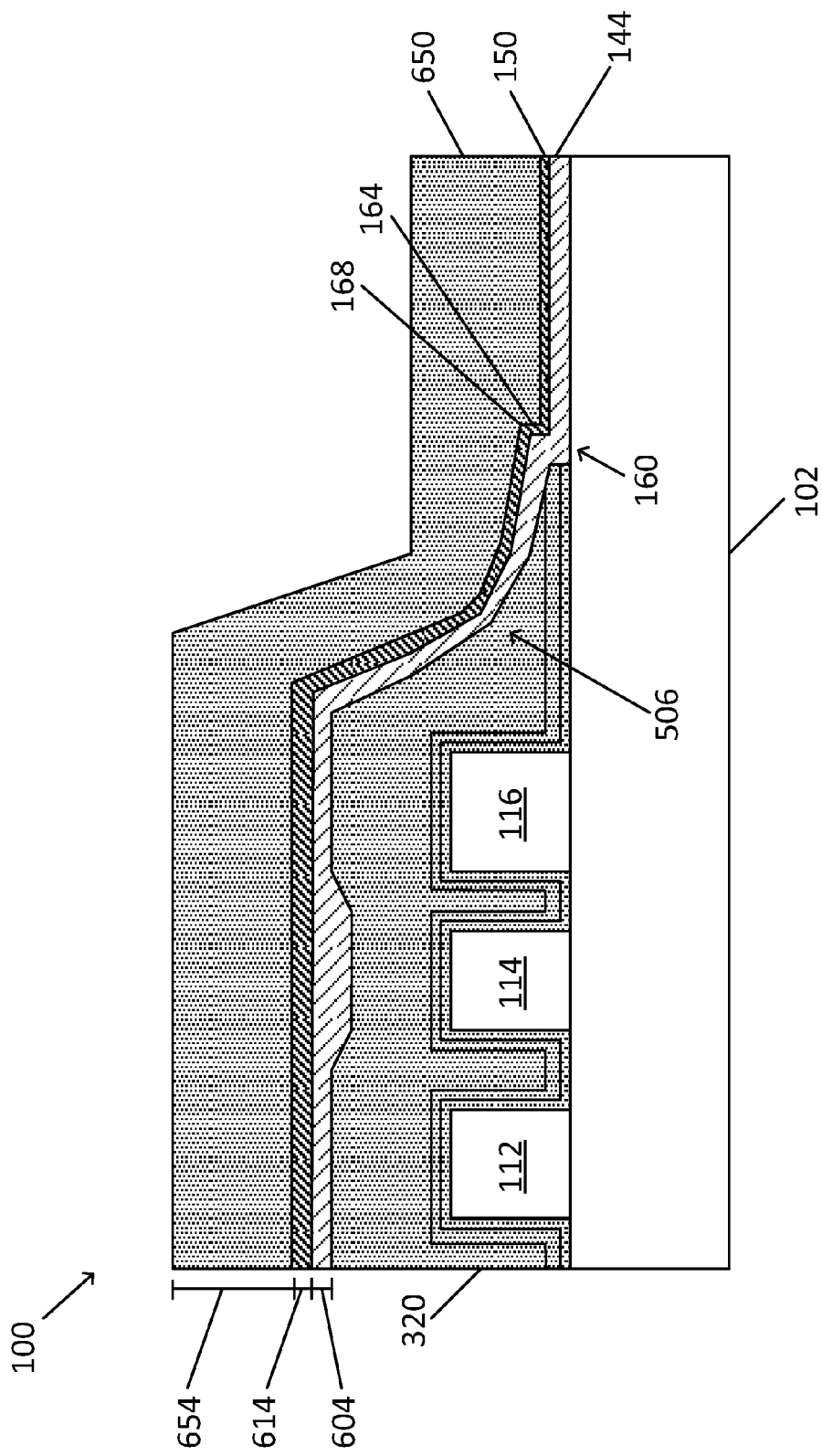
FIG. 6 illustrates forming a second layer of semiconductor material associated with forming a semiconductor arrangement, according to an embodiment.

Turning to FIG. 6, in an embodiment, a dielectric layer 144 is formed over the first portion 500, the second portion 504, and the second area 516. In some embodiments, the dielectric layer 144 covers the first layer of semiconductor material 320. The dielectric layer 144 comprises any number of materials, including, for example, HfSiO, HfSiON, HfTaO, HfTiO, HfZrO, AlO, ZrO, TiO, $Ta_2O_5$, $Y_2O_3$, $SrTiO_3$ (STO), $BaTiO_3$ (BTO), BaZrO, HfLaO, HfSio, LaSiO, AlSiO, (Ba, Sr)$TiO_3$ (BST), $Al_2O_3$, $Si_3N_4$, oxynitrides, high-k dielectric materials, etc., alone or in combination. According to some embodiments, the dielectric layer 144 comprises a standard dielectric material with a medium dielectric constant, such as $SiO_2$, for example. The dielectric layer 144 is formed in any number of ways, such as by atomic layer deposition (ALD), chemical vapor deposition (CVD), physical vapor deposition (PVD), etc., alone or on combination. In an embodiment, the dielectric layer 144 comprises a thickness 604 of about 1 nm to about 6 nm, for example. In some embodiments, the thickness 604 corresponds to the thickness 154. In some embodiments, however, the thickness 604 does not correspond to the thickness 154.

In an embodiment, a conductive layer 150 is formed over the first portion 500, second portion 504, and the second area 516, In some embodiments, the conductive layer 150 covers the dielectric layer 144. The conductive layer 150 comprises any number of materials, such as conductive metal materials including, for example, aluminum, copper, tungsten, titanium, TiN, TaN, AlN, etc., alone or in combination. In an embodiment, the conductive layer 150 comprises a thickness 614 of about 1 nm to about 6 nm, for example. In some embodiments, the thickness 614 corresponds to the thickness 148. In some embodiments, however, the thickness 614 does not correspond to the thickness 148, In an embodiment, the conductive layer 150 comprises a material used in forming one or more metal gates.

According to some embodiments, the dielectric layer 144 and conductive layer 150 adhere to the contoured shape 506 of the first layer 320, such that the dielectric layer 144 and the conductive layer 150 comprise the angle 164, corner 168 and second angle 165.

In an embodiment, a second layer of semiconductor material 650 is formed over the first portion 500, second portion 504, and the second area 516. In some embodiments, the second layer of semiconductor material 650 covers the conductive layer 150. The second layer of semiconductor material 650 is formed in any number of ways, such as by deposition, for example, According to some embodiments, the second layer of semiconductor material 650 comprises a silicon, polysilicon, etc., alone or in combination. In an embodiment, the second layer of semiconductor material 650 comprises a thickness 654 of about 20 nm to about 150 nm, for example.

Figure 7:
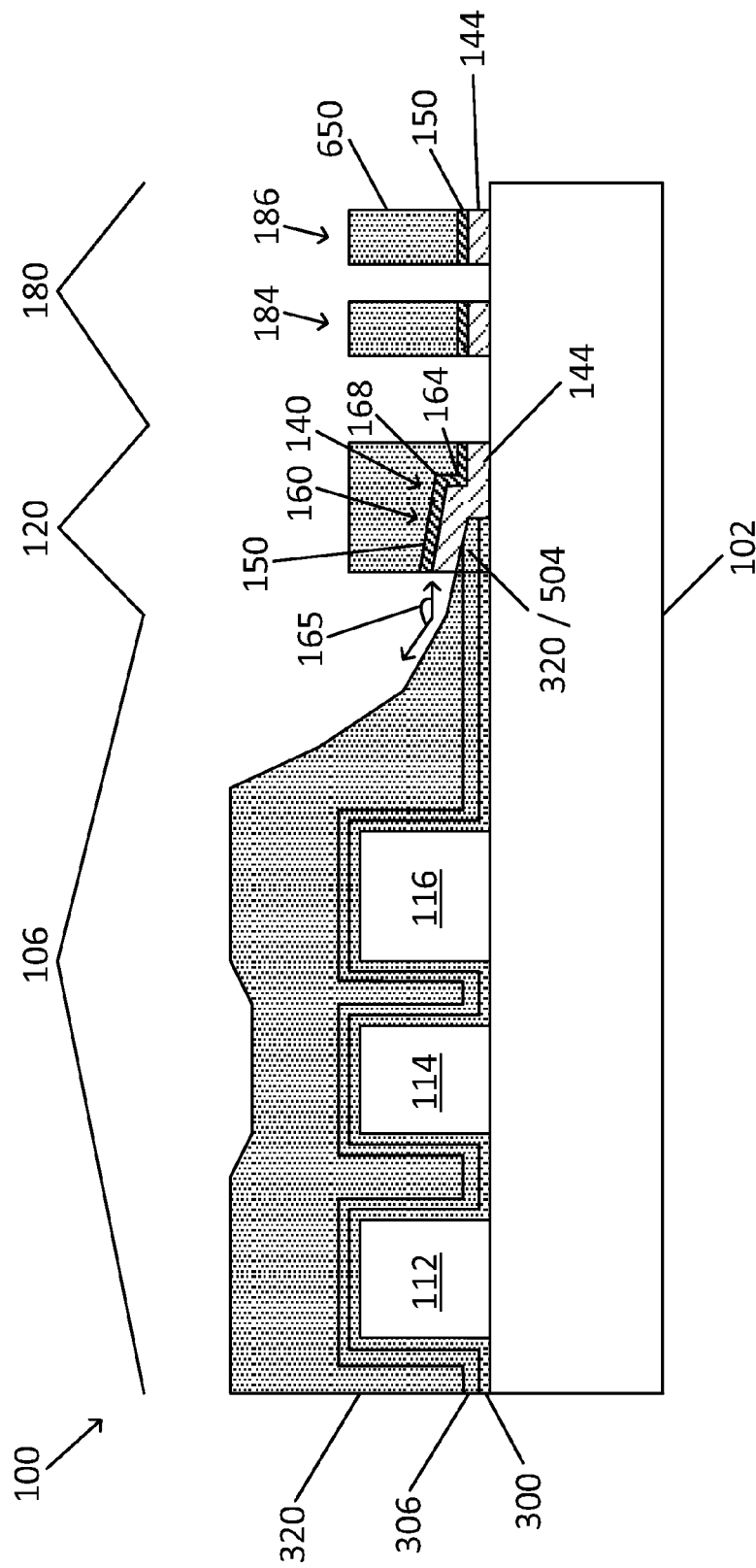
FIG. 7 illustrates patterning the second layer of semiconductor material associated with forming a semiconductor arrangement, according to an embodiment.

Turning to FIG. 7, in an embodiment, the second layer of semiconductor material 650 is patterned to form the guard region 120 adjacent to the active region 106, where at least some of the second portion 504 of the first layer of semiconductor material 320 is comprised within the guard region 120. Portions of the dielectric layer 144 and conductive layer 150 are similarly comprised within the guard region 120. The second layer of semiconductor material 650 is patterned in any number of ways, such as via etching and lithography with at least one of a resist or hardmask. According to some embodiments, one or more non-active devices 184, 186 are formed in the non-active region. In some embodiments, at least some of the non-active devices are high-k metal gate devices.

According to some embodiments, the dielectric layer 144 and conductive layer 150 are removed as part of the patterning of the second layer of semiconductor material 650 or are removed in separate operations, such as over the active region 106. At least some of the first layer of semiconductor material 320, the dielectric layer 144 and the conductive layer 150 remain within the guard region as residue 140 from the active region. According to some embodiments, the residue has a profile 160 comprising at least one of the angle 164, the corner 168 or the second angle 165.

According to some embodiments, the first layer of semiconductor material 320 is removed. The first layer of semiconductor material 320 is removed in any number of ways, such as by etching, for example. In an embodiment, the barrier layer 306 covering the active devices 112, 114, 116 inhibits etching or removal of the active devices 112, 114, 116 when the first layer of semiconductor material is removed.

In some embodiments, after the first layer of semiconductor material 320 is removed, such as over the active region 106, the second layer of semiconductor material 650 of one or more of the non-active devices 184, 186 is removed and replaced by metal gates. In some embodiments, such metal gates are formed by a metal gap fill process. In some embodiments, a CMP process is also used in forming such metal gates. According to some embodiments, an interlayer dielectric layer 700 (illustrated in FIG. 1) is subsequently formed. According to some embodiments, the interlayer dielectric layer 700 is formed over the active region 106, guard region 1120, and non-active region 180.

Figure 8:
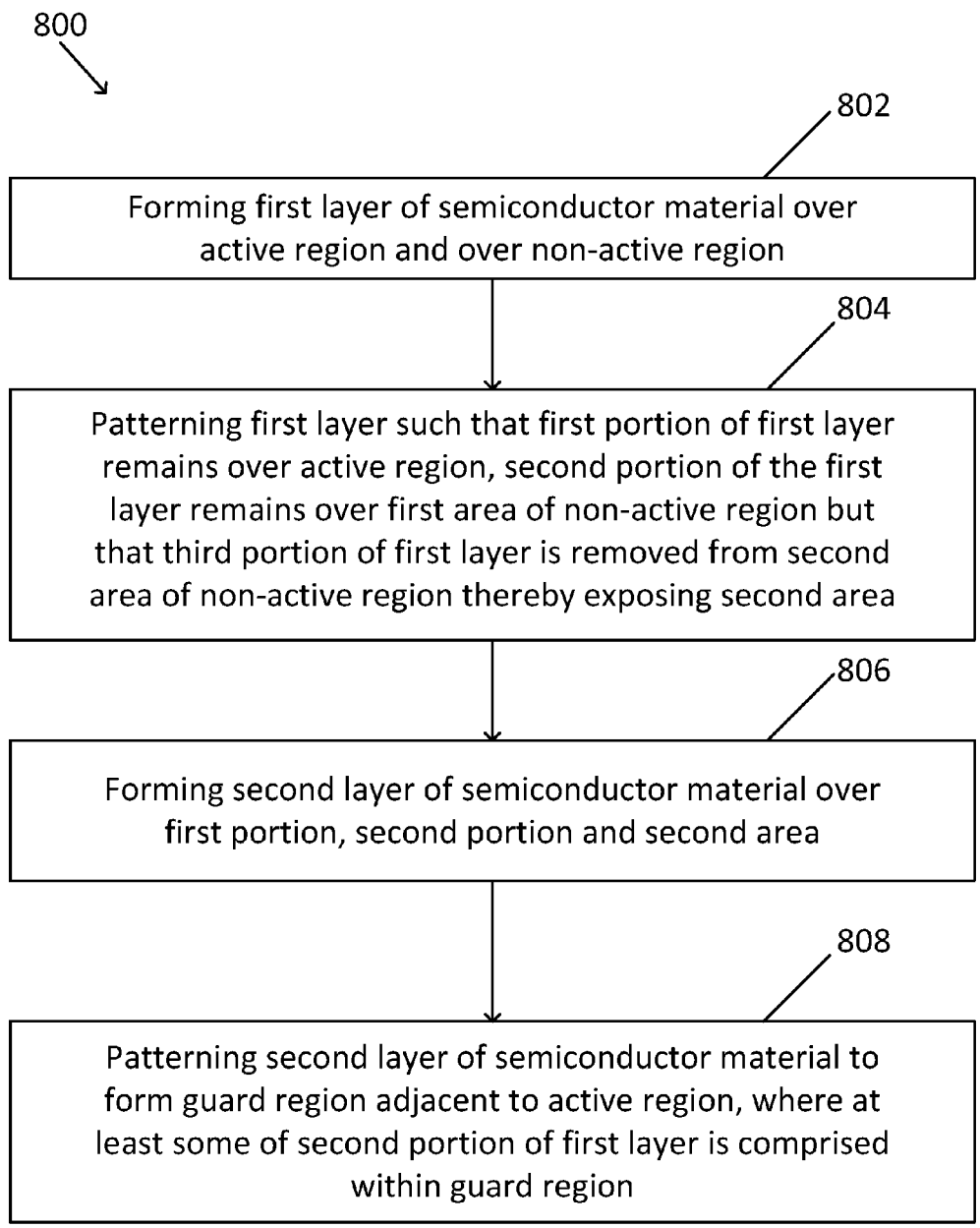
FIG. 8 illustrates a method of forming a semiconductor arrangement, according to an embodiment.

Turning to FIG. 8, in an embodiment, a method 800 of forming a semiconductor arrangement is provided. In an embodiment, at 802, the method 800 comprises forming a first layer of semiconductor material over an active region and over anon-active region. In some embodiments, the non-active region comprises a high-k metal gate region comprising one or more high-k metal gate devices. In an embodiment, at 804, the method 800 comprises patterning the first layer such that a first portion of the first layer remains over the active region, a second portion of the first layer 144 remains over a first area of the non-active region but that a third portion of the first layer is removed from a second area of the non-active region thereby exposing the second area. In an embodiment, at 806, the method 800 comprises forming a second layer of semiconductor material over the first portion, the second portion and the second area. In an embodiment, at 808, the method 800 comprises patterning the second layer of semiconductor material to form a guard region adjacent to the active region, where at least some of the second portion of the first layer is comprised within the guard region, such as a residue within the guard region.

According to some embodiments, forming the semiconductor arrangement as provided herein allows one or more patterning or etching operations to be combined, thus reducing a total number of operations to be performed. According to some embodiments, forming the semiconductor arrangement as provided herein requires fewer masks to be used. It will be appreciated that by encapsulating the residue 140 within the guard region 120, the residue 140 is less likely to cause adverse effects, such as contamination issues, for example, within the semiconductor arrangement 100.

In an embodiment, a semiconductor arrangement comprises a guard region and an active region disposed on a first side of the guard region. In an embodiment, the active region comprises an active device. In an embodiment, the guard region comprises residue from the active region.

In an embodiment, a semiconductor arrangement comprises a guard region and an active region disposed on a first side of the guard region. In an embodiment, the active region comprises an active device. In an embodiment, the guard region comprises a dielectric region and residue from the active region within the dielectric region, the residue comprises at least one of a semiconductor layer, a dielectric layer or a conductive layer.

In an embodiment, a method of forming a semiconductor arrangement comprises forming a first layer of semiconductor material over an active region and over a non-active region. In an embodiment, the method comprises patterning the first layer such that a first portion of the first layer remains over the active region, a second portion of the first layer remains over a first area of the non-active region but that a third portion of the first layer is removed from a second area of the non-active region thereby exposing the second area. In an embodiment, the method comprises forming a second layer of semiconductor material over the first portion, the second portion and the second area. In an embodiment, the method comprises patterning the second layer of semiconductor material to form a guard region adjacent to the active region, where at least some of the second portion of the first layer is comprised within the guard region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   an active region comprising an active device; and
   a guard region disposed on a first side of the active region and comprising residue from the active region, wherein the residue comprises:
   an etch stop layer;
   a semiconductor material layer disposed over the etch stop layer and in direct contact with the etch stop layer; and a first dielectric layer disposed over the semiconductor material layer, wherein the first dielectric layer is in direct contact with the semiconductor material layer and in direct contact with the etch stop layer.

2. The semiconductor arrangement of claim 1, wherein the first dielectric layer is in direct contact with a top surface of the etch stop layer and a sidewall of the etch stop layer.

3. The semiconductor arrangement of claim 2, wherein the semiconductor material layer is in direct contact with the top surface of the etch stop layer.

4. The semiconductor arrangement of claim 1, wherein the guard region comprises:
a conductive layer disposed over the first dielectric layer and in direct contact with a top surface of the first dielectric layer and a sidewall of the first dielectric layer.

5. The semiconductor arrangement of claim 1, wherein the guard region comprises:
a second dielectric layer disposed under the etch stop layer.

6. The semiconductor arrangement of claim 1, wherein the semiconductor material layer comprises a polysilicon material.

7. The semiconductor arrangement of claim 5, wherein the second dielectric layer is in direct contact with a top surface of a substrate upon which the semiconductor arrangement is formed.

8. The semiconductor arrangement of claim 7, wherein the first dielectric layer is in direct contact with a sidewall of the second dielectric layer.

9. The semiconductor arrangement of claim 1, comprising a third dielectric layer in direct contact with the first dielectric layer, the etch stop layer, and the semiconductor material layer.

10. The semiconductor arrangement of claim 8, wherein the first dielectric layer is in direct contact with the top surface of the substrate.

11. The semiconductor arrangement of claim 1, comprising a non-active region disposed on a side of the guard region opposite to the active region.

12. The semiconductor arrangement of claim 11, wherein the non-active region comprises a logic device.

13. A semiconductor arrangement comprising:
an active region comprising an active device; and
a guard region disposed on a first side of the active region and comprising residue from the active region, wherein the residue comprises:
an etch stop layer;
a semiconductor material layer disposed over the etch stop layer; and
a dielectric layer disposed over the semiconductor material layer, wherein the dielectric layer is in direct contact with the semiconductor material layer and in direct contact with the etch stop layer.

14. A semiconductor arrangement comprising:
an active region;
a guard region around the active region and comprising residue from the active region, wherein the residue comprises:
a first dielectric layer;
an etch stop layer disposed over the first dielectric layer;
a semiconductor material layer disposed over the etch stop layer;
a second dielectric layer disposed over the semiconductor material layer, wherein the second dielectric layer is in direct contact with the semiconductor material layer, in direct contact with the etch stop layer, and in direct contact with the first dielectric layer; and
a conductive layer disposed over the second dielectric layer and in direct contact with the second dielectric layer; and
a third dielectric layer in direct contact with the first dielectric layer, in direct contact with the etch stop layer, in direct contact with the semiconductor material layer, in direct contact with the second dielectric layer, and in direct contact with the conductive layer.

15. The semiconductor arrangement of claim 14, the third dielectric layer in direct contact with the active region.

16. The semiconductor arrangement of claim 14, wherein the conductive layer is substantially conformally disposed over the second dielectric layer.

17. The semiconductor arrangement of claim 14, wherein the first dielectric layer is in direct contact with a substrate.

18. The semiconductor arrangement of claim 17, wherein the second dielectric layer is in direct contact with the substrate.

19. The semiconductor arrangement of claim 14, wherein the first dielectric layer, the etch stop layer, and the semiconductor material layer are disposed between a portion of the second dielectric layer and the active region.

20. The semiconductor arrangement of claim 14, wherein the etch stop layer is in direct contact with a top surface of the first dielectric layer.

* * * * *